US011675017B2

(12) United States Patent
Kroener et al.

(10) Patent No.: US 11,675,017 B2
(45) Date of Patent: Jun. 13, 2023

(54) METHOD AND APPARATUS FOR DEVICE-SPECIFIC DETERMINATION OF AN INTERNAL-RESISTANCE BASED STATE OF HEALTH OF A BATTERY

(71) Applicant: Robert Bosch GmbH, Stuttgart (DE)

(72) Inventors: Christoph Kroener, Rosstal (DE); Christian Simonis, Leonberg (DE); Tobias Huelsing, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/472,420

(22) Filed: Sep. 10, 2021

(65) Prior Publication Data

US 2022/0099745 A1 Mar. 31, 2022

(30) Foreign Application Priority Data

Sep. 29, 2020 (DE) ..................... 10 2020 212 298.9

(51) Int. Cl.

*G01R 31/389* (2019.01)
*H02J 7/00* (2006.01)
*G01R 31/392* (2019.01)
*B60L 58/16* (2019.01)
*G01R 31/367* (2019.01)

(52) U.S. Cl.

CPC ............ *G01R 31/389* (2019.01); *B60L 58/16* (2019.02); *G01R 31/367* (2019.01); *G01R 31/392* (2019.01); *H02J 7/005* (2020.01); *B60L 2200/10* (2013.01); *B60L 2200/12* (2013.01)

(58) Field of Classification Search

None

See application file for complete search history.

(56) References Cited

U.S. PATENT DOCUMENTS

2013/0110429 A1* 5/2013 Mitsuyama .......... G01R 31/392 702/63
2015/0198675 A1* 7/2015 Hebiguchi ........... G01R 31/374 324/430
2019/0170826 A1 6/2019 Shoa Hassani Lashidani
2021/0033675 A1* 2/2021 Ukumori ............... H02J 7/0049

FOREIGN PATENT DOCUMENTS

DE 10 2017 103 617 A1 8/2018
EP 3 663 780 A1 6/2020

* cited by examiner

*Primary Examiner* — Jas A Sanghera

(74) *Attorney, Agent, or Firm* — Maginot, Moore & Beck LLP

(57) ABSTRACT

A method for determining an internal-resistance based state-of-health of a battery in a device includes determining the internal-resistance based state-of-health of the battery using a hybrid state-of-health model including a physical ageing model and a correction model by (i) determining, based on an electrochemical battery model, a physical state-of-health according to one or more operating parameters of the battery using the physical ageing model, (ii) mapping operating features derived from the one or more operating parameters onto a correction parameter using the correction model that includes a data-based configuration, and (iii) applying the correction parameter to the physical state of health to determine the internal-resistance based state-of-health. The method further includes determining a modeled battery voltage, and determining a characteristic of the modeled battery voltage using an adaptation model.

20 Claims, 3 Drawing Sheets

C
R1
R2
V
$U_m$

METHOD AND APPARATUS FOR DEVICE-SPECIFIC DETERMINATION OF AN INTERNAL-RESISTANCE BASED STATE OF HEALTH OF A BATTERY

This application claims priority under 35 U.S.C. § 119 to patent application no. DE 10 2020 212 298.9, filed on Sep. 29, 2020 in Germany, the disclosure of which is incorporated herein by reference in its entirety.

The disclosure relates to batteries, in particular for electrically powered motor vehicles, and also to measures for determining a state-of-health determination based on a rate of change of an internal resistance according to a customer specification, manufacturer specification or device specification.

BACKGROUND

Electrically powered motor vehicles are supplied with electrical power usually by means of vehicle batteries. The state of health of the vehicle battery decreases appreciably over the course of its lifetime, resulting in a decreasing maximum storage capacity. The degree to which the vehicle battery has aged depends on a load that is specific to the vehicle battery.

In the case of batteries, the state of health is the key indicator of a remaining battery capacity or remaining battery charge. The state of health is a measure of how far the battery has aged since the beginning of life of the battery. The state of health can be expressed as a capacity retention rate (SOHC) or as a rise in the internal resistance (SOHR) given by a rate of change. The capacity retention rate SOHC is expressed as a ratio of the measured instantaneous capacity to an initial capacity of the fully charged battery.

The relative change in the internal resistance SOHR increases with increasing ageing of the battery. When determining the internal-resistance based state of health, different approaches to determining the internal-resistance based state of health are provided depending on battery-specific internal-resistance values. The information on the internal-resistance based state of health therefore depends heavily on the determination rule, which can be defined for a specific device or a specific manufacturer.

SUMMARY

According to the disclosure, a method for determining an internal-resistance based state of health of a battery, and a corresponding apparatus are provided.

According to a first aspect, a method is provided for determining an internal-resistance based state of health of a battery, comprising the following steps:

- determining an internal-resistance based state of health using a hybrid state-of-health model comprising an electrochemical ageing model and a correction model, wherein the electrochemical ageing model is designed to provide a physical state of health according to one or more operating parameters of the battery, wherein the correction model has a data-based design in order to map operating features derived from the one or more operating parameters onto a correction parameter, wherein the correction parameter is applied to the physical state of health in order to determine the internal-resistance based state of health;
- using an adaptation model to determine a characteristic of a modeled battery voltage, which characteristic is modeled on the basis of internal states of the physical ageing model and on the basis of a characteristic of at least one battery current;
- providing the modeled battery voltage to the physical ageing model in order to determine the physical state of health.

The state of health can be determined on the basis of the internal resistances of an electronic equivalent circuit of a battery. The internal resistances of the battery are defined differently on a customer-specific basis, however, and therefore there is a problem with using the same algorithm platform to take into account the internal-resistance based state of health on these different definitions.

The state of health of a battery can be determined using a hybrid state-of-health model. This provides using a physical ageing model, which determines a state of health on the basis of operating parameters and an electrochemical battery model. The electrochemical battery model describes the battery behavior using a series of differential equations that describe the electrochemical equilibrium states, and characterizes the battery state by a multiplicity of internal states.

In addition, a data-based correction model is provided, which delivers a correction parameter according to operating features. The operating features are derived from the characteristics of one or more operating parameters of the battery, for instance the characteristic of the battery current, and in particular the characteristic of the battery voltage, the characteristic of the battery temperature and/or the characteristic of the state of charge. In addition, the operating features can be derived on the basis of internal states of the physical ageing model. The correction parameter is applied to the physical state of health in order to obtain the latest state of health.

The internal resistance, which is obtained from an equivalent circuit adopted for a battery, is often used, alongside other parameters, to characterize a battery. The determination of these internal resistances is defined differently according to device manufacturer, and therefore the information based thereon about the state of health depends heavily on the definition of the determination of the internal resistances.

The adaptation model can be designed to determine, on the basis of an electronic equivalent circuit, the characteristic of the modeled battery voltage as a function of the characteristic of the battery current on the basis of differential equations.

An idea in the above method consists in supplying to the physical ageing model not only the operating parameters, but also a modeled battery voltage (modeled terminal voltage) obtained from an adaptation model, which modeled battery voltage is obtained by simulating the operating parameters using the internal-resistance values of the battery equivalent circuit that have been determined in accordance with the device-specific definition.

It can be provided that the adaptation model makes the characteristic of the modeled battery voltage according to at least one internal resistance, wherein the at least one internal resistance is determined from one or more internal states of the physical ageing model.

The adaptation model uses a simple electrical battery model based on the internal resistances and the way in which they are interconnected in the battery equivalent circuit, and simulates a corresponding battery voltage depending on the way in which the internal resistances have been determined. For example, internal resistances for calculating the state of health are defined as dU/dI for a specific constant current, for a given time period of e.g. 10s and for a specific battery temperature of e.g. T=25° C. This means that a specific voltage difference is determined for a specific constant current flow for a given time period, in order to determine the corresponding internal resistance. The way in which the internal resistance is determined therefore represents, in accordance with the equivalent circuit model, an influence on the battery voltage that is evaluated in the state-of-health model in order to determine the state of health.

Thus the adaptation model is used to compensate for the different ways of determining the internal resistance of the battery, with the result that the same architecture of the hybrid state-of-health model can always be used.

In order also to allow the state-of-health model to take into account the device specification for determining the internal resistance on the basis of reference data indicating a measured state-of-health of the battery at a specific time, the electrochemical ageing model can be adapted on the basis of the reference data by adapting the internal states of the physical ageing model according to a difference between the modeled state of health and measured state of health corresponding to the reference data.

For instance, when measuring a state of health, at least one of the internal states of the physical ageing model can be adapted according to a difference between the modeled internal-resistance based state of health and the measured state of health.

It can also be provided that the data-based correction model is retrained if there is sufficient training data available.

BRIEF DESCRIPTION OF THE DRAWINGS

Embodiments are explained in more detail below with reference to the accompanying drawings, in which.

DETAILED DESCRIPTION

Figure 1:
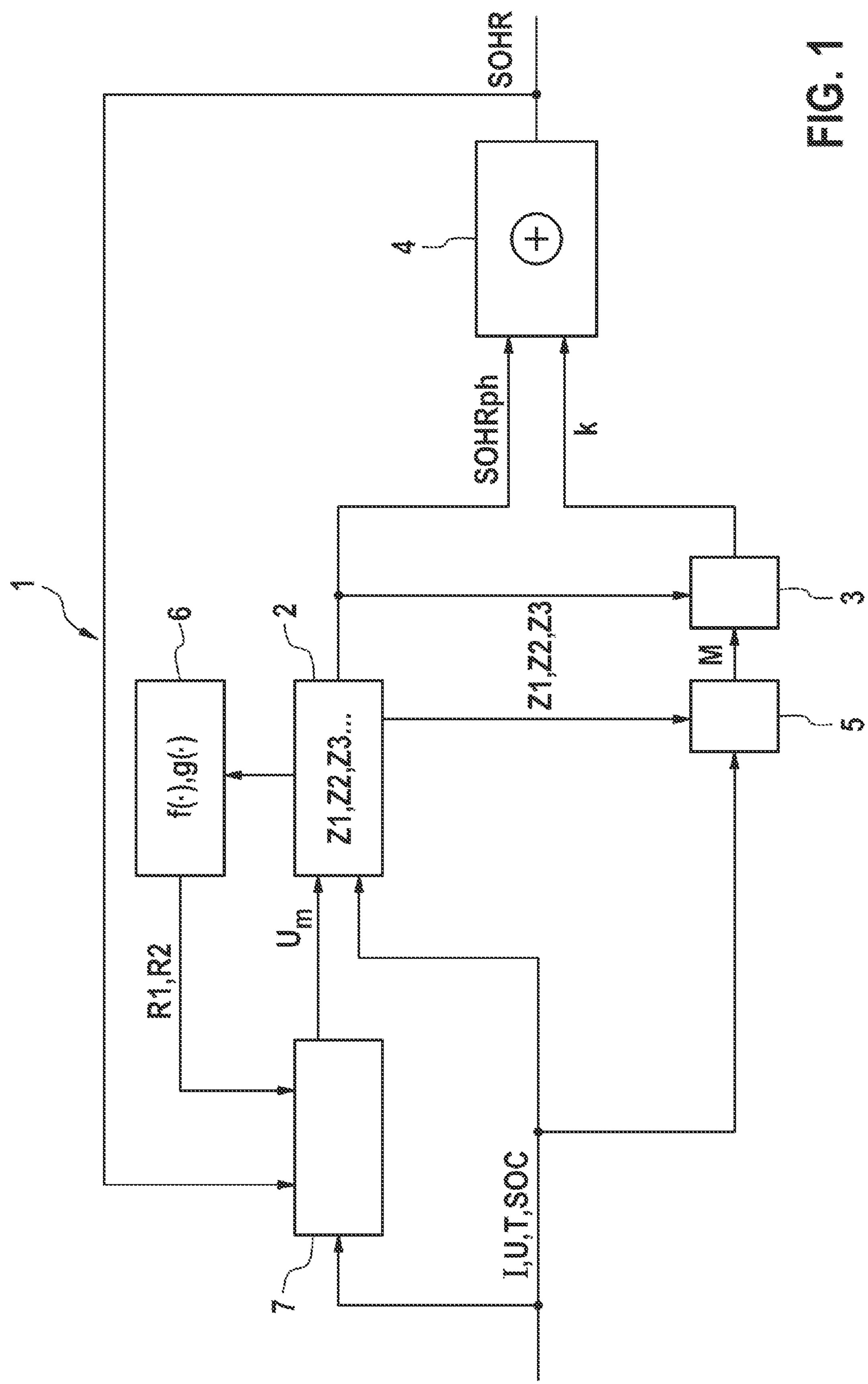
FIG. 1 is a block diagram for illustrating a function for determining a customer-specific internal-resistance based state of health.

FIG. 1 shows a schematic block diagram of a state-of-health model 1 for providing a device-specific internal-resistance based state of health SOHR according to customized calculation guidelines for one or more internal resistances.

The state-of-health model 1 has a hybrid design and has at its core a physical ageing model 2, which provides a physical state of health. This is done using characteristics of operating parameters of the battery, namely the characteristics of the battery current I, the battery voltage U, the battery temperature T and the state of charge SOC as input parameters. The physical ageing model 2 is embodied as an electrochemical battery model, and uses differential equations to describe respective electrochemical states Z1, Z2, Z3 . . . , such as layer thicknesses (e.g. SEI thickness), change in the cyclable lithium resulting from anode/cathode side reactions, rapid electrolyte depletion, slow electrolyte depletion, loss of the active material in the anode, loss of the active material in the cathode, and suchlike. The physical ageing model 2 gives a physical state of health SOHRph according to the characteristics of the operating parameters of the battery and depending on the internal electrochemical states Z1, Z2, Z3 . . . .

The model values for the physical state of health SOHR that are provided by the electrochemical model are imprecise in certain situations, however, and it is therefore provided to correct these using a correction parameter k. A data-based correction model 3 is provided for this purpose, which is embodied as a machine learning model, for instance as a Gaussian process model. The correction model 3 is trained to map operating features M and the physical state of health SOHRph onto the correction parameter k.

In a correction block 4, the physical state of health SOHRph is corrected by the correction parameter k in order to output the internal-resistance based state of health SOHR. The correction parameter k can be applied in an additive, multiplicative or other manner.

In an operating-feature block, operating features M are derived from the operating parameters I, U, T, SOC and from the internal electrochemical states Z1, Z2, Z3 . . . of the ageing model 2.

The operating features M are referred to an analysis time period. The analysis time period may range from a few hours (e.g. 6 hours) up to several weeks (e.g. a month) for determining the state of health. A typical value for the analysis time period is one week.

The operating features can comprise, for example, features referred to the analysis time period and/or accumulated features and/or statistical values obtained over the entire lifespan up to that point in time. In particular, the operating features can comprise for example: electrochemical states (layer thicknesses, concentrations, cyclable lithium, . . . ), histogram data for the state-of-charge characteristic, for the temperature, for the battery voltage, for the battery current, in particular histogram data relating to the battery temperature distribution over the state of charge, the state-of-charge distribution over the temperature and/or the discharge-current distribution over the temperature, accumulated total charge (Ah), an average increase in capacity during a charging process (in particular for charging processes in which the increase in charge lies above a threshold proportion (e.g. 20%) of the total battery capacity), a maximum of the differential capacity (dQ/dU: change in charge divided by change in battery voltage), and others.

Additional information can be obtained from the operating features: a load pattern over time, for instance charging and driving cycles, defined by usage patterns (such as rapid charging at high current levels or rapid deceleration or braking with recuperation), a usage time of the vehicle battery, a cumulative charge over the operating life and a cumulative discharge over the operating life, a maximum charging current, a maximum discharge current, frequency of charging, an average charging current, an average discharge current, a power throughput during charging and discharging, a charging temperature (in particular an average charging temperature), a spread (in particular an average spread) in the state of charge, and suchlike.

In addition, an internal-resistance determination block 6 is provided, which acquires the internal states Z1, Z2, Z3 from the physical ageing model and converts them, in accordance with a suitable calculation rule R1=f(Z1, Z2, Z3 . . . ) and R2=g(Z1, Z2, Z3 . . . ), into the internal resistances R1 and R2, which characterize the battery in their electronic equivalent circuit. The conversion functions g( ), f( ) can be provided as a parameterized polynomial function, as a data-based function model or suchlike. The conversion is based on the assumption that there is a linear relationship between the resistances R1, R2 and the states Z1, Z2, Z3. The parameters that describe the linear relationship can be fitted using the training data.

The physical ageing model 2 is designed to receive characteristics of operating parameters of the battery, in particular the battery current, the battery voltage, the battery temperature and the latest state of charge. In order to use the structure of the state-of-health model also for other forms of calculations of the state of health SOHR, it is now intended to use an adaptation model 7 to model a battery voltage $U_m$ that takes into account the modified calculation of the internal-resistance based state of health.

Figure 3:
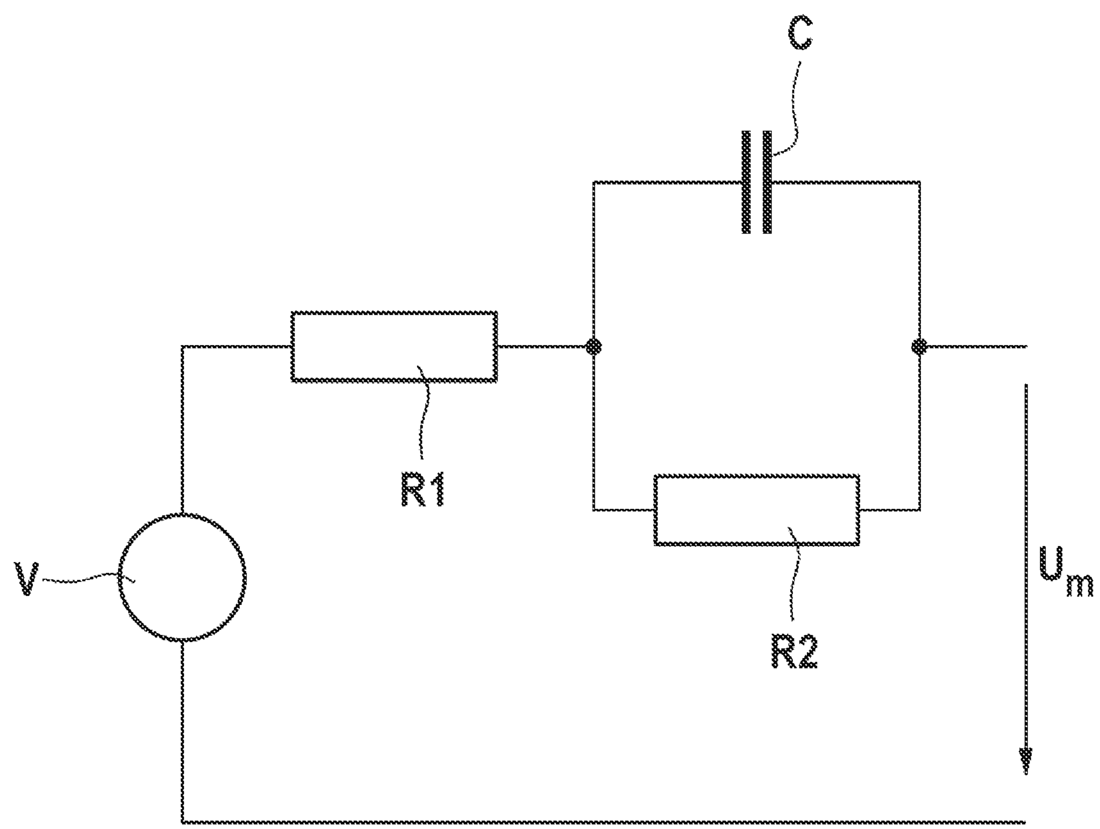
FIG. 3 is an equivalent circuit of the battery for illustrating the interconnection of the internal resistances.

This is done by supplying the internal resistances R1, R2 determined in the internal-resistance block 6 to the adaptation model 7, which contains an electrical battery model based on an electronic equivalent circuit of the battery. The battery model uses the structure of the electronic equivalent circuit of the battery to model on the basis of the characteristics of the operating parameters I, U, T, SOC and the latest state of health SOHR, the characteristic of the battery voltage $U_m$, which replaces the measured battery voltage U (terminal voltage) from the operating parameters. FIG. 3 shows schematically one such battery equivalent circuit containing an ideal voltage source V, the internal resistances R1, R2 and a capacitance C. Further RC networks can be provided. The physical ageing model 2 is thereby operated in such a way as to determine a physical state of health SOHRph that is adapted in accordance with the modified device specification.

This allows the hybrid state-of-health model 1 to be used for different requirements for determining the state of health in terms of the internal-resistance based state of health SOHR.

If reference data for the state of health is obtained from the battery operation, then this data is used to adapt the internal states Z1, Z2, Z3 . . . of the physical ageing model. The reference data corresponds to measured states of health, which are used to adapt the physical ageing model 2 as soon as possible after they are measured.

The physical ageing model 2 is adapted in steps given by $$Z1 \leftarrow Z1 + \varepsilon1 \cdot (SOHR - SOHR_{meas}),$$

$$Z2 \leftarrow Z2 + \varepsilon2 \cdot (SOHR - SOHR_{meas}),$$

$$Z3 \leftarrow Z3 + \varepsilon3 \cdot (SOHR - SOHR_{meas}),$$

where $SOHR_{meas}$ is the measured state of health from the reference data, and ε1, ε2, ε3 correspond to a weighting and learning rate used to adapt the internal state Z1, Z2, Z3 . . . of the physical ageing model 2. By means of the internal-resistance block 6, this results in the internal resistances R1, R2 also being modified in the adaptation model 7, in order to adapt the calculation of the modeled battery voltage $U_m$ to the modified internal resistances R1, R2. Overall, the internal resistances R1 and R2 are the result of the electrochemical ageing model, augmented by the data-based model correction.

Figure 2:
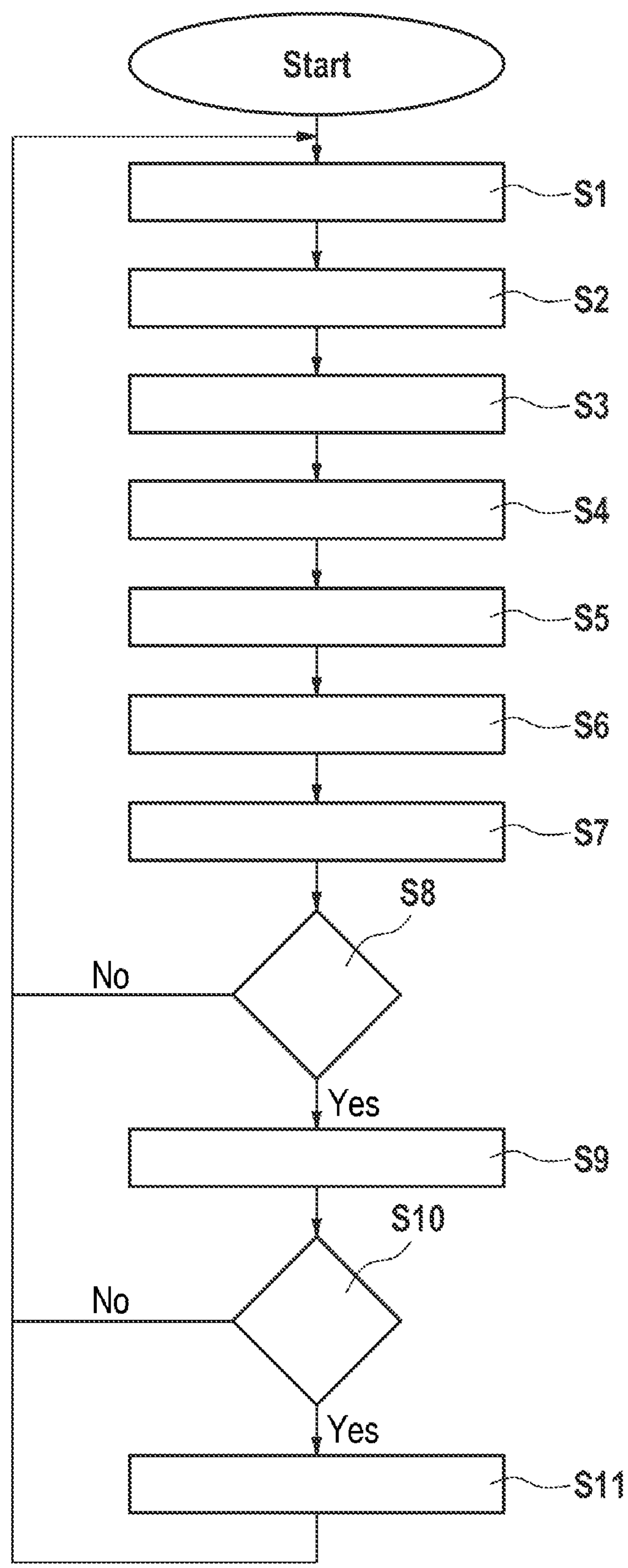
FIG. 2 is a flow diagram for illustrating a method for operating a state-of-health model for determining a customer-specific state of health.

The method for operating the state-of-health model 1 is described in greater detail below with reference to the flow diagram of FIG. 2. The method is performed in a battery control unit, where it is implemented in hardware and/or software.

In step S1, the operating parameters I, T, SOC of the battery are acquired, namely the battery current, the battery temperature and the latest state of charge.

The operating parameters are used in the adaptation model 7 in step S2 to determine the modeled battery voltage $U_m$. This is done on the basis of specified internal resistances R1, R2 and using differential equations for an electrical battery model known per se, which can map the battery current I, the state of charge SOC and the battery temperature T onto a battery voltage $U_m$.

The operating parameters I, T, SOC, the modeled battery voltage $U_m$ and the latest state of health SOHR are supplied to the physical ageing model 2 in step S3. The physical ageing model 2 uses electrochemical differential equations to determine the equilibrium states of the battery in order to model a physical state of health SOHRph.

In addition, in step S4, operating features are generated in the operating-feature block 5 from the operating parameters I, U, T, SOC and supplied to the correction model 3. In addition, the operating-feature block 5 is supplied with the internal states Z1, Z2, Z3 from the physical ageing model 2, which likewise are used to determine operating features.

In step S5, a correction parameter k is determined in the correction model 3 from the operating features and from the physical state of health SOHRph, and is applied to the physical state of health SOHRph in the correction block 4 in order to obtain the latest state of health SOHR.

The latest state of health SOHR is provided to the adaptation model in step S6, in order to determine continuously the battery voltage according to the latest state of health.

In step S7, the internal resistances R1 and R2, which are used in the adaptation model 7 for modelling the battery voltage $U_m$, are derived from the internal states Z1, Z2, Z3, . . . .

In step S8, a check is performed to ascertain whether reference data is available. The reference data comprises a state of health $SOH_{meas}$ measured in the battery. If the measured state of health $SOH_{meas}$ differs from the latest state of health SOHR by more than a specified threshold value (alternative: yes), then the method proceeds with step S9, otherwise (alternative: no), the method jumps back to step S1.

In step S9, the internal states Z1, Z2, Z3 from the physical ageing model are adapted, in particular in accordance with the above rule, and then the method proceeds with step S10.

In step S10, a check is performed to ascertain, for instance by means of a threshold-value comparison with the number of training datasets, whether sufficient training data is available for retraining the correction model. If this is the case (alternative: yes), the method proceeds with step S10, otherwise it jumps back to step S1.

In step S11, the correction model 3 is updated or trained further using the new training data, which training data comprises a series of training datasets relating to different analysis time periods. The training datasets correspond to assignments of measured states of health to operating feature points as a combination of operating features and internal states from the physical ageing model 2. Then the method jumps back to step S1.

What is claimed is:

1. A method for determining an internal-resistance based state-of-health of a battery in a device, comprising:

determining the internal-resistance based state-of-health of the battery using a hybrid state-of-health model comprising a physical ageing model and a correction model by:

determining, based on an electrochemical battery model, a physical state-of-health according to one or more operating parameters of the battery using the physical ageing model, mapping operating features derived from the one or more operating parameters onto a correction parameter using the correction model that includes a data-based configuration, and applying the correction parameter to the physical state of health to determine the internal-resistance based state-of-health;

determining a modeled battery voltage;

determining a characteristic of the modeled battery voltage using an adaptation model, the characteristic of the modeled battery voltage based on (i) internal states of the physical ageing model, and (ii) a characteristic of at least one battery current;

providing the modeled battery voltage to the physical ageing model in order to determine the physical state of health according to the modeled battery voltage; and using the adaptation model to determine, based on an electronic equivalent circuit, the characteristic of the modeled battery voltage as a function of the characteristic of the battery current according to differential equations.

2. The method according to claim 1, further comprising: adapting, when measuring a state-of-health, the one or more internal states of the physical ageing model according to a difference between the internal-resistance based state-of-health and the measured state-of-health.

3. The method according to claim 1, wherein the correction model is trained if there is sufficient training data available.

4. The method according to claim 1, wherein:

a central unit is configured to perform the method, and the central unit includes the one or more operating parameters as provided by the device containing the battery.

5. The method according to claim 1, wherein the device containing the battery is a motor vehicle, a pedelec, an aircraft, a drone, a power tool, an IoT device, an autonomous robot, or a household device.

6. The method according to claim 1, wherein a computer program comprising commands which, when the computer program is executed by at least one data processing facility, cause the at least one data processing facility to perform the method.

7. The method according to claim 6, wherein the computer program is stored on a non-transitory machine-readable storage medium.

8. The method according to claim 1, further comprising:

determining the characteristic of the modeled battery voltage, using the adaptation model, according to at least one internal resistance; and determining the at least one internal resistance from the one or more internal states of the physical ageing model.

9. A method for determining an internal-resistance based state-of-health of a battery in a device, comprising:

determining the internal-resistance based state-of-health of the battery using a hybrid state-of-health model comprising a physical ageing model and a correction model by:

determining, based on an electrochemical battery model, a physical state-of-health according to one or more operating parameters of the battery using the physical ageing model, mapping operating features derived from the one or more operating parameters onto a correction parameter using the correction model that includes a data-based configuration, and applying the correction parameter to the physical state of health to determine the internal-resistance based state-of-health;

determining a modeled battery voltage;

determining a characteristic of the modeled battery voltage using an adaptation model, the characteristic of the modeled battery voltage based on (i) internal states of the physical ageing model, and (ii) a characteristic of at least one battery current;

providing the modeled battery voltage to the physical ageing model in order to determine the physical state of health according to the modeled battery voltage;

determining the characteristic of the modeled battery voltage, using the adaptation model, according to at least one internal resistance; and determining the at least one internal resistance from the one or more internal states of the physical ageing model.

10. The method according to claim 9, further comprising:

using the adaptation model to determine, based on an electronic equivalent circuit, the characteristic of the modeled battery voltage as a function of the characteristic of the battery current according to differential equations.

11. The method according to claim 9, further comprising:

adapting, when measuring a state-of-health, the one or more internal states of the physical ageing model according to a difference between the internal-resistance based state-of-health and the measured state-of-health.

12. The method according to claim 9, wherein the correction model is trained if there is sufficient training data available.

13. The method according to claim 9, wherein:

a central unit is configured to perform the method, and the central unit includes the one or more operating parameters as provided by the device containing the battery.

14. The method according to claim 9, wherein the device containing the battery is a motor vehicle, a pedelec, an aircraft, a drone, a power tool, an IoT device, an autonomous robot, or a household device.

15. An apparatus for determining an internal-resistance based state-of-health of a battery, comprising:

at least one battery control unit configured to:

determine the internal-resistance based state-of-health of the battery using a hybrid state-of-health model comprising a physical ageing model and a correction model by:

determining, based on an electrochemical battery model, a physical state-of-health according to one or more operating parameters of the battery using the physical ageing model, mapping operating features derived from the one or more operating parameters onto a correction parameter using the correction model that includes a data-based configuration, and applying the correction parameter to the physical state of health to determine the internal-resistance based state-of-health;

determine a modeled battery voltage;

determine a characteristic of the modeled battery voltage using an adaptation model, the characteristic of the modeled battery voltage based on (i) internal states of the physical ageing model, and (ii) a characteristic of at least one battery current;

provide the modeled battery voltage to the physical ageing model in order to determine the physical state of health according to the modeled battery voltage; and adapt, when measuring a state-of-health, the one or more internal states of the physical ageing model according to a difference between the internal-resistance based state-of-health and the measured state-of-health.

16. The apparatus according to claim 15, wherein the at least one battery control unit configured to:

use the adaptation model to determine, based on an electronic equivalent circuit, the characteristic of the modeled battery voltage as a function of the characteristic of the battery current according to differential equations.

17. The apparatus according to claim 15, wherein the at least one battery control unit configured to:

determine the characteristic of the modeled battery voltage, using the adaptation model, according to at least one internal resistance; and determine the at least one internal resistance from the one or more internal states of the physical ageing model.

18. The apparatus according to claim 15, wherein the at least one battery control unit configured to:

train the correction model if there is sufficient training data available.

19. The apparatus according to claim 15, further comprising:

a central unit including the at least one battery control unit, and the central unit includes the one or more operating parameters, as provided by a device containing the battery.

20. The apparatus according to claim 15, wherein the apparatus is a motor vehicle, a pedelec, an aircraft, a drone, a power tool, an IoT device, an autonomous robot, or a household device.

* * * * *